US008624186B2

(12) United States Patent
Wang et al.

(10) Patent No.: US 8,624,186 B2
(45) Date of Patent: Jan. 7, 2014

(54) MOVABLE DETECTOR FOR CHARGED PARTICLE BEAM INSPECTION OR REVIEW

(75) Inventors: Yi-Xiang Wang, Fremont, CA (US); Joe Wang, Campbell, CA (US); Xuedong Liu, San Jose, CA (US); Zhongwei Chen, San Jose, CA (US)

(73) Assignee: Hermes Microvision, Inc., Hsin-chu (TW)

( * ) Notice: Subject to any disclaimer, the term of this patent is extended or adjusted under 35 U.S.C. 154(b) by 242 days.

(21) Appl. No.: 12/787,139

(22) Filed: May 25, 2010

(65) Prior Publication Data

US 2011/0291007 A1  Dec. 1, 2011

(51) Int. Cl.
*H01J 37/244* (2006.01)

(52) U.S. Cl.
CPC .................. *H01J 37/244* (2013.01)
USPC .............. 250/310; 250/307; 250/397

(58) Field of Classification Search
USPC .......................... 250/310, 397, 307
See application file for complete search history.

(56) References Cited

U.S. PATENT DOCUMENTS

| | | | | |
|---|---|---|---|---|
| 4,941,980 A * | 7/1990 | Halavee et al. | ................ | 250/310 |
| 5,198,675 A * | 3/1993 | Hikita et al. | .................. | 250/397 |
| 5,644,132 A * | 7/1997 | Litman et al. | ................. | 250/310 |
| 6,580,074 B1 * | 6/2003 | Sato et al. | ..................... | 250/310 |
| 7,105,816 B2 * | 9/2006 | Kamiya et al. | ................ | 250/311 |
| 7,141,791 B2 * | 11/2006 | Masnaghetti et al. | ........ | 250/311 |
| 7,705,304 B2 * | 4/2010 | Kawamata et al. | ........... | 250/310 |
| 7,928,382 B2 * | 4/2011 | Hatakeyama et al. | ........ | 250/310 |
| 2011/0215241 A1 * | 9/2011 | Wang et al. | ................... | 250/307 |

* cited by examiner

*Primary Examiner* — Jack Berman
(74) *Attorney, Agent, or Firm* — WPAT, PC; Justin King (57) ABSTRACT

The present invention generally relates to a detection unit of a charged particle imaging system. More particularly, portion of the detection unit can move into or out of the detection system as imaging condition required. With the assistance of a Wein filter (also known as an E×B charged particle analyzer) and a movable detector design, the present invention provides a stereo imaging system that suitable for both low current, high resolution mode and high current, high throughput mode. Merely by way of example, the invention has been applied to a scanning electron beam inspection system. But it would be recognized that the invention could apply to other system using charged particle beam as an observation tool.

20 Claims, 6 Drawing Sheets

MOVABLE DETECTOR FOR CHARGED PARTICLE BEAM INSPECTION OR REVIEW

FIELD OF THE INVENTION

The present invention generally relates to a detection unit of a charged particle imaging system. More particularly, a portion of the detection unit can move into or out of the detection system as imaging condition required.

BACKGROUND OF THE INVENTION

Moore's law describes a long-term trend in the history of computing hardware, in which the number of transistors that can be placed inexpensively on an integrated circuit has doubled approximately every two years. The capabilities of many digital electronic devices are strongly linked to Moore's law: processing speed, memory capacity, sensors and even the number and size of pixels in digital cameras. All of these are improving at (roughly) exponential rates as well. Currently, the design node is shrinking to 22 nm or even smaller, however, this making the defect inspection tool, such as an optical system, hard to detect the anomalies present on the wafer. It is due to the resolution of the conventional light sources used is no longer smaller than the dimension of anomalies. For advancing resolution in defect inspection, a more applicable inspection tool, such as an e-beam inspection tool, is introduced to semiconductor manufacturing processes inspection. Further, in VC (voltage contrast) mode inspection, the e-beam inspection tool can even discover underlayer defect, which is almost impossible for nowadays optical inspection systems. Hence, the e-beam inspection tool becomes more important in semiconductor processes.

In a regular anomaly hunting process, large field of view and VC mode inspection, a larger beam current ($I_b$) such as several hundreds nano-amperes (nA) are applied in the e-beam inspection systems. Once the anomalies are located, on the other hand, to review and analyze the cause of these anomalies requires high resolution of the e-beam inspection system and a smaller beam current such as several tens of pico-amperes (pA) are applied instead.

Up to the present, the only e-beam system can handle both larger currents and small currents inspection is disclosed by Wang et al. in "Charged Particle Beam Detection Unit with Multi Type Detection Subunits", U.S. patent application Ser. No. 12/715,766 filed on Mar. 2, 2010. The previous multi type design is able to handle the large and small beam currents for both high resolution and high speed requirements. However, it sacrifices the side view function for stereo image.

The present invention provides a detection unit and a system that could perform regular a large range of beam current inspection with stereo image; perform defect review that requires high resolution and small beam current and perform defect review and fine defect inspection with stereo image.

BRIEF SUMMARY OF THE INVENTION

The present invention generally relates to a detection unit of a charged particle imaging system. More particularly, portion of the detection unit can move into or out of the detection system as imaging condition required. With the assistance of a Wein filter (also known as an ExB charged particle analyzer), the present invention provides an imaging system that suitable for both low current, high resolution mode and high current, high throughput mode. Merely by way of example, the invention has been applied to a scanning electron beam inspection system. But it would be recognized that the invention could apply to other system using charged particle beam as an observation tool.

One embodiment of the present invention adopts sectional detection unit integrate to collect signal electrons for a charged particle beam imaging system while performing regular large beam current with stereo image.

Another embodiment of the present invention, the signal electron is directed to a movable detector by a Wein filter, also known as ExB charged particle analyzer, while performing defect review or fine detail inspection which requires high resolution and low beam current.

And yet another embodiment of the present invention, a high gain sectional movable detector is selected to perform anomalies review or fine detail inspection and composes a stereo anomaly image.

This invention provides a method for specimen surface imaging by replacing specified detection area to receiving signal charged particles. The method comprises steps of providing a charged particle beam system to irradiate charged particles onto specimen surface; providing a sectional main detector to receiving the signal charged particles emanating from specimen surface, wherein the detector has at least 2 sections for composing stereo image under regular large beam current, low resolution mode; providing a movable high gain detector set to receiving the signal charged particles emanating from specimen surface, wherein the detector has at least 1 sections for composing image under small beam current, high resolution mode; providing a movable sectional high gain detector to receiving the signal charged particles emanating from specimen surface, wherein the detector has at least 2 sections for composing stereo image under small beam current, high resolution mode; providing a Wein filter or an ExB charge particle analyzer to direct the signal charged particles emanating from specimen surface to the detection area set by control computer; providing a control computer to calculate the superimposed magnetic field strength and electrostatic field strength of the Wein filter or the ExB charge particle analyzer that divert the emanating electrons according to the incident beam energy and preset imaging requirement; and generating images based on the detected signal particles received by the specified detector.

The sectional main detector in this invention can be a solid state detector, an E-T (Everhart-Thornley) detector, and the movable high gain detector can be a solid state detector. The movable high gain detector can be positioned not over, or near the optical axis where the primary beam passes through, positioned when the low beam current, high resolution mode is selected, or positioned below the main sectional detector when the low beam current, high resolution and stereo image mode is selected.

This invention also provides a signal receiving device for an inspection tool. The signal receiving device comprises a first detector on-axis to the primary beam of the inspection tool, and a second detector movable from outside of a column of the inspection tool into inside of the column. The signal receiving device further comprises means for moving the second detector from outside of the column into inside of the column.

The first detector has low gain than the second detector, and the second detector can be off-axis to the primary beam of the inspection tool. The signal receiving device further comprises an energy filter in front of the detection surface of the second detector to receive signal electrons with certain energy, wherein the energy filter comprises a first mesh for receiving the signals, a second mesh close to the detection surface of the second detector, an energy screen mesh between the first mesh and the second mesh with a potential lower than a bias of a specimen in the inspection tool, and a metal shell enclosing the first mesh, the second mesh, and the energy screen mesh. The metal shell is grounded, and the signal receiving device further comprises a Wein filter to direct the signals from the inspection tool to the second detector.

The second detector can be on-axis to the primary beam of the inspection tool, and the first detector is over the second detector while the signal receiving device inspects a specimen in the inspection tool under a small beam current, high resolution mode.

The first detector is above an objective lens of the inspection tool and receives a signal current larger than the second detector, and the second detector is for inspecting a specimen in the inspection tool under a small beam current, high resolution mode.

DETAILED DESCRIPTION OF THE INVENTION

Reference will now be made in detail to specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations are not described in detail in order not to unnecessarily obscure the present invention.

The present invention generally relates to a detection unit of a charged particle imaging system. More particularly, portion of the detection unit can move into or out of the detection system as imaging condition required. With the assistance of a Wein filter (also known as an E×B charged particle analyzer) and a movable detector design, the present invention provides an imaging system that suitable for both low current, high resolution mode and high current, high throughput mode.

Merely by way of example, the invention has been applied to a scanning electron beam inspection system. But it would be recognized that the invention could apply to other system using charged particle beam as an observation tool.

This invention is directed to a signal receiving device for an inspection tool, or a device for receiving signal charged particles from the inspection tool. The inspection tool can be an electron beam system, more particularly a scanning electron microscope. This invention also relates to a method for detecting signal charged particles with different detection configurations to detect both regular large beam current, low resolution mode and small beam current, high resolution mode in-situ.

The signal receiving device comprises a first main detector on-axis to the primary beam of the inspection tool, and a second detector movable from outside a column of the inspection tool into inside the column, wherein the first detector has low gain than the second detector. The first detector, which is a sectional main detector for receiving signal charged particles emanated from a specimen surface, has at least two sections for configuring a stereo image under the regular large beam current, low resolution mode. The second detector, which is a movable high gain detector for receiving signal charged particles emanated from the specimen surface, has at least one section for configuring an image under a small beam current, high resolution, or at least two sections for configuring another stereo image under the small beam current, high resolution mode. The first detector is above an objective lens of the inspection tool and receives a signal current larger than the second detector, and the second detector is for inspecting a specimen in the inspection tool under a small beam current, high resolution mode. The first detector, in one embodiment, can be solid state detector, E-T detector, and the second detector can be solid state detector, wherein the solid state detector can be semiconductor photodiode detector, such as PiN photodiodes.

If the second detector is off-axis to primary beam of the inspection tool, the signal receiving device may further comprise an energy filter at incident surface of the second detector to eject signals from the inspection tool containing sufficient energy, wherein the energy filter is used to filter low energy signal electrons. The metal shell is grounded, and the signal receiving device further comprises a Wein filter to direct the signals from the inspection tool to the second detector. The Wein filter, is an E×B charged particle analyzer for directing the signal charged particles emanated from the specimen surface to a specified area.

If the second detector is on-axis to the primary beam of the inspection tool, the second detector has an aperture centered to let charged particles from the inspection tool passing through the aperture, and the first detector is over the second detector while the signal receiving device inspects a specimen in the inspection tool under a small beam current, high resolution mode.

The signal receiving device further comprises means for moving the second detector from outside the column into inside the column, wherein the means includes mechanism suitable for configuring the second detector outside or inside the column.

Figure 1:
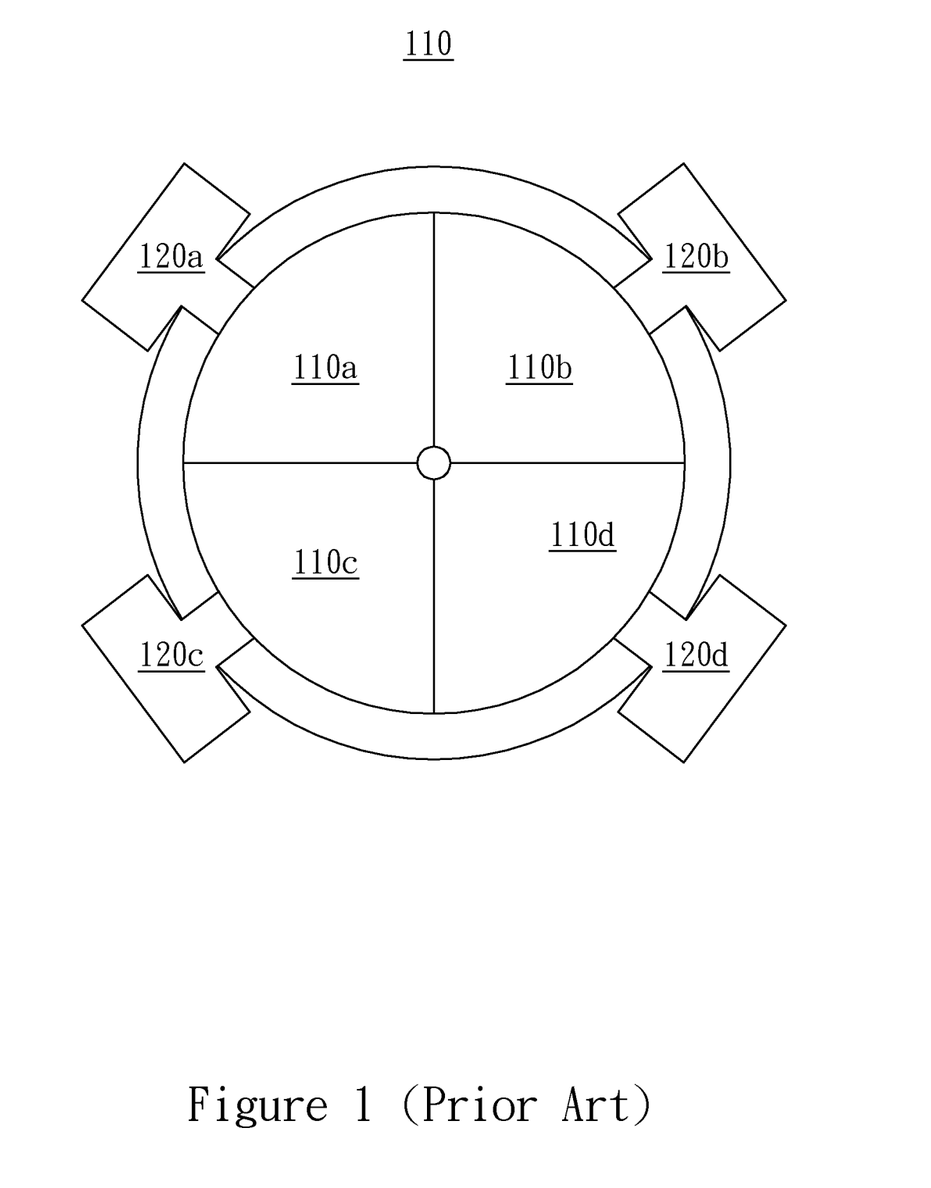
FIG. 1 is a diagrammatic representation of a top view of sectional detector (prior art U.S. patent application Ser. No. 11/755,705).

FIG. 1 is a sectional detector disclosed by Tseng et al. in U.S. patent application Ser. No. 11/755,705 for stereo image while performing a regular anomalies hunting process that requires larger beam current (Ib) and high throughput. The sectional detector 110 is composed of four quadric-sections 110a, 110b, 110c, and 110d. The detector 110 has a center hole 130 to let the primary beam pass through. The received signal of each section will be amplified by its own amplifier, e.g. 120a, 120b, 120c, and 120d. During imaging process, an image processing unit in the control computer will process the signals collects from an each section of detector 110 and composes them into a stereo image.

Figure 2:
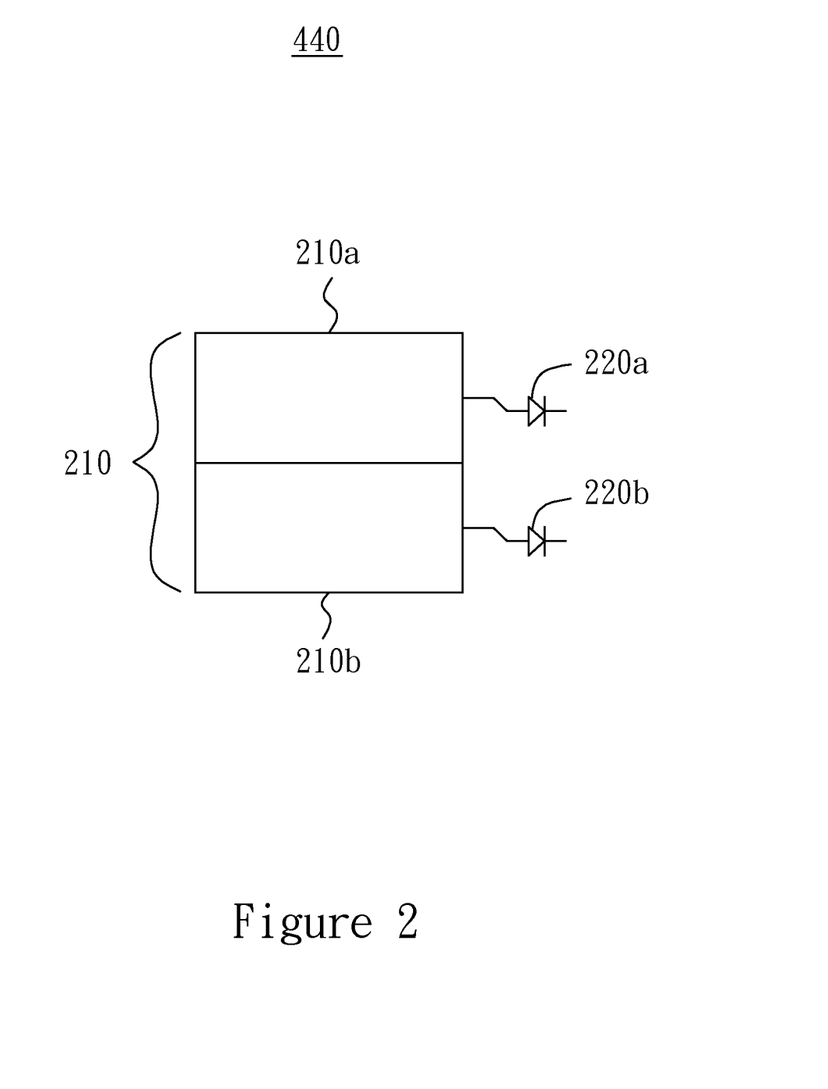
FIG. 2 is a diagrammatic representation of a top view of movable detector with energy filter according to an embodiment of the present invention.
Figure 3:
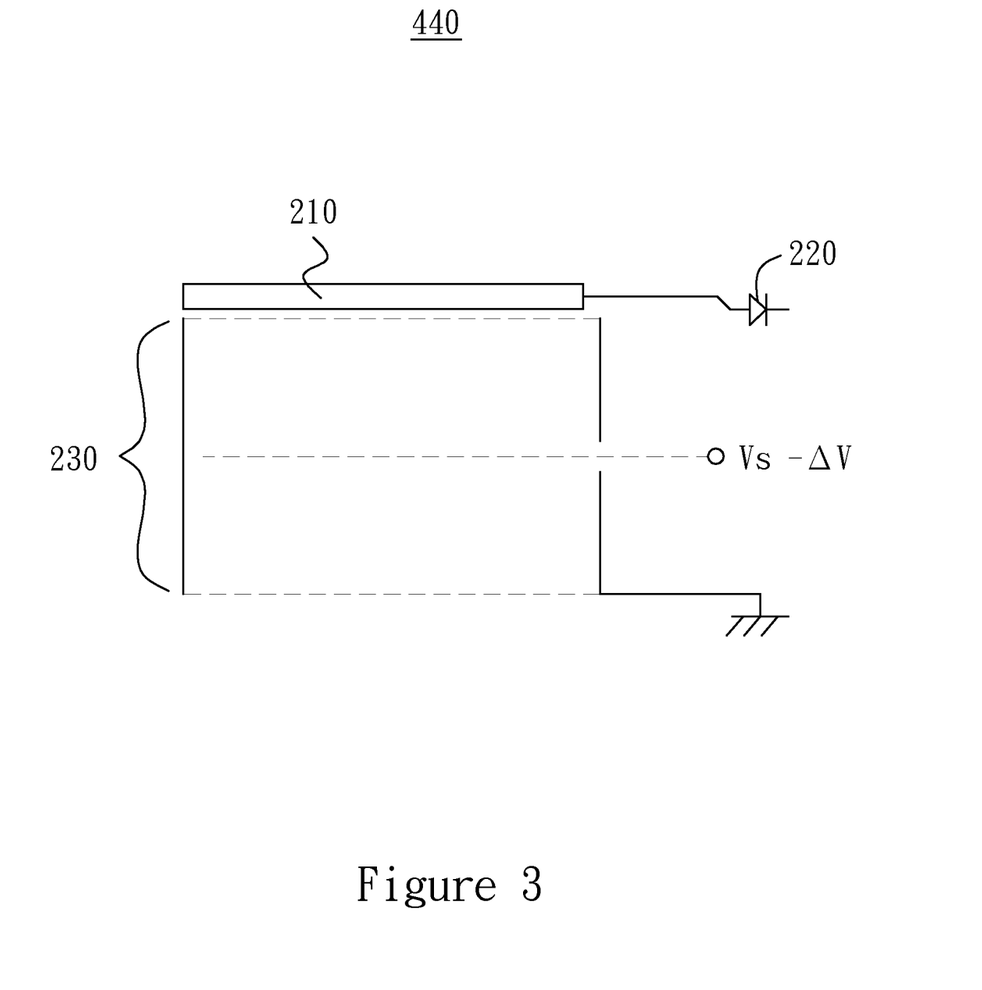
FIG. 3 is a diagrammatic representation of a side view of movable detector with energy filter according to an embodiment of the present invention.

FIG. 2 is a top view sketching of a movable detector set 440 and FIG. 3 is a side view sketching of the movable detector set 440 of the present invention. The movable detector set includes a high gain detector 210 and an energy filter 230 in front of the high gain detector 210. The detected signal of the high gain detector is amplified by amplifier 220. The energy filter 230 is used to filter low energy signal electrons, and can be referred to U.S. Pat. No. 7,141,791. While the charged particle system is performing anomalies review or fine defect inspection process that requires high resolution and low beam current, the SE and BSE emanating from the specimen surface are directed to the movable detector 210 by a Wien filter (not shown in FIGS. 2 and 3). The high gain detector 210 in FIG. 2, for example, is not necessary be just one detector unit. It can be patched by more than one detector unit, for example, 210a and 210b. Signals received from independent detector units 210a and 210b may be transferred into respective signal amplifiers 220a and 220b for stereo image mode.

Figure 4:
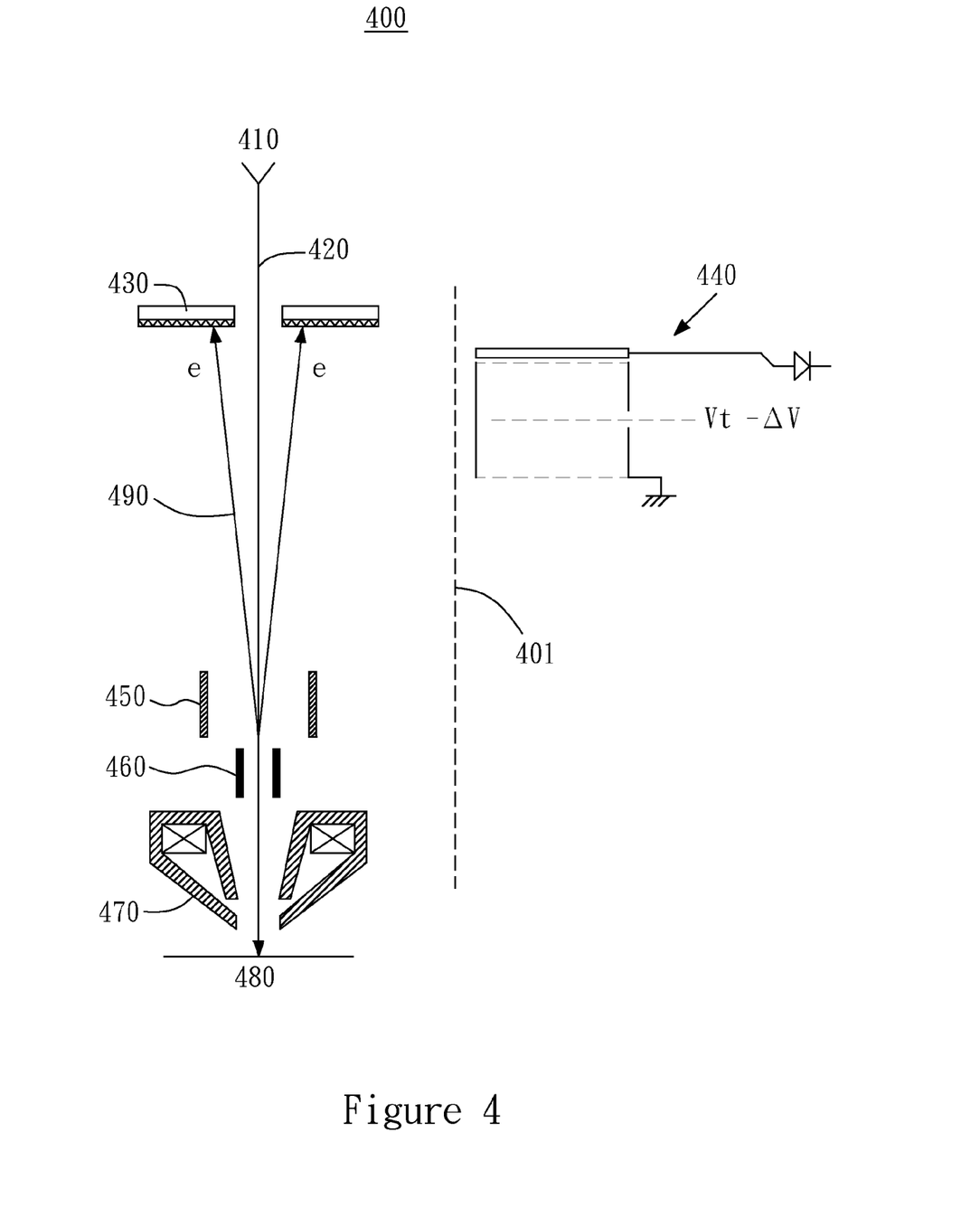
FIG. 4 is a diagrammatic representation of signal electrons trajectory and the position of the movable detector while performing regular inspection according to an embodiment of the present invention.

FIG. 4 illustrates the signal electrons trajectory and the position of the movable detector 440 while performing regular anomalies hunting inspection. A primary beam of a charged particle beam 420 is emitted from a charged particle emitter (tip) 410 through an objective lens 470 to a surface of target 480. The primary beam 420 is focused by the objective lens 470 into a beam probe and scanning across the target 480 surface by the deflector 460. Signal electrons 490, for example, backscattered electrons (BSE) and secondary electrons (SE) that emanate from the target 480 surface are collected by main detector 430 to form an image of the target 480 surface. The main detector 430 can be a solid state detector, an E-T detector. While performing a regular inspection the movable detector set 440 is positioned out of the boundary 401 of e-beam column. One embodiment of the present invention the main detector 430 is a low gain, fast respond sectional detector that can present stereo image of the target 480 surface. The sectional detector for stereo image was disclosed in U.S. Pat. No. 7,705,301 by Tseng et al.

Figure 5:
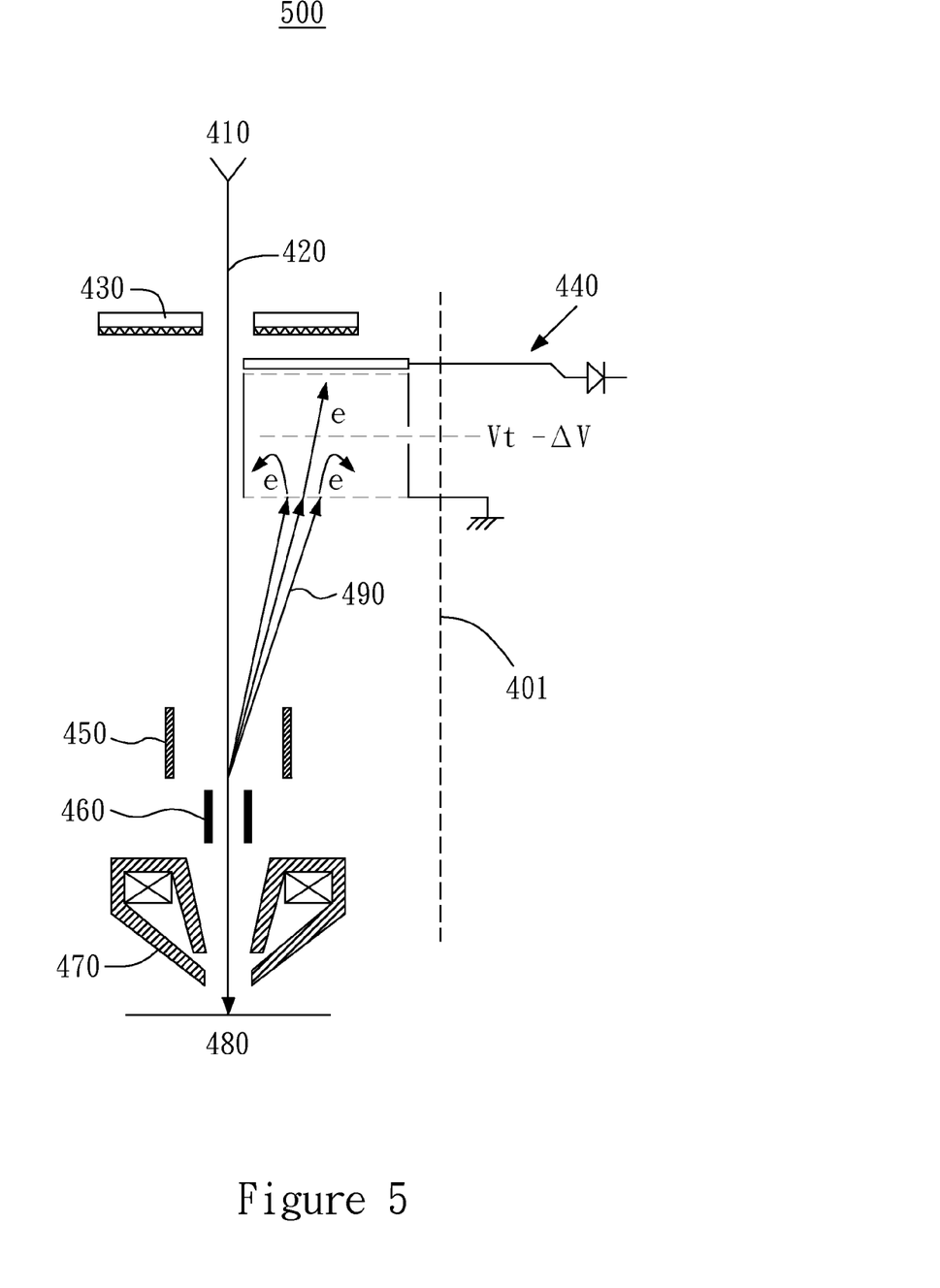
FIG. 5 is a diagrammatic representation of signal electrons trajectory that have been directed to movable detector of the detection system by an E×B charged particle analyzer while performing defect review or inspection according to an embodiment of the present invention.

FIG. 5 illustrates the signal electrons trajectory and the position of the movable detector 440 while performing anomalies review or fine detail inspection which requires high resolution and small beam current. The movable detector 440 can be a solid state detector. A primary beam of the charged particle beam 420 is emitted from a charged particle emitter (tip) 410 through the objective lens 470 to the surface of target 480. The primary beam 420 is focused by the objective lens 470 into a beam probe and scanning across the target 480 surface by the deflector 460. Signal electrons 490, i.e. including BSE and SE, that emanate from the target 480 surface are directed to a movable detector set 440 by a Wien filter 450, or an E×B charged particle analyzer. The movable detector set 440 is in position within the e-beam column now while performing an anomalies review or fine detail inspection. The movable detector 440 is off-axis to the primary beam, which is positioned not over the optical axis where the primary beam 420 passes through, but near the primary beam of the charged particle beam 420. The energy filter 230, as shown in FIG. 3, in front of the high gain detector 210 will reject those electrons contain insufficient energy to make sure all electrons into the high gain detector 210 are emanated from target 280 surface. The collected signal electrons are amplified by the amplifier 220 and then send to image processing unit (not shown) to compose image of target surface. The movable detector set 440 is pushed into a position from outside e-beam column boundary 401 when the high resolution mode is selected. The edge of the detection area of the movable detector set 440 is set carefully not over the center optical axis where the primary beam passing through. This design can avoid complicate alignment process while positioning the detector.

Figure 6:
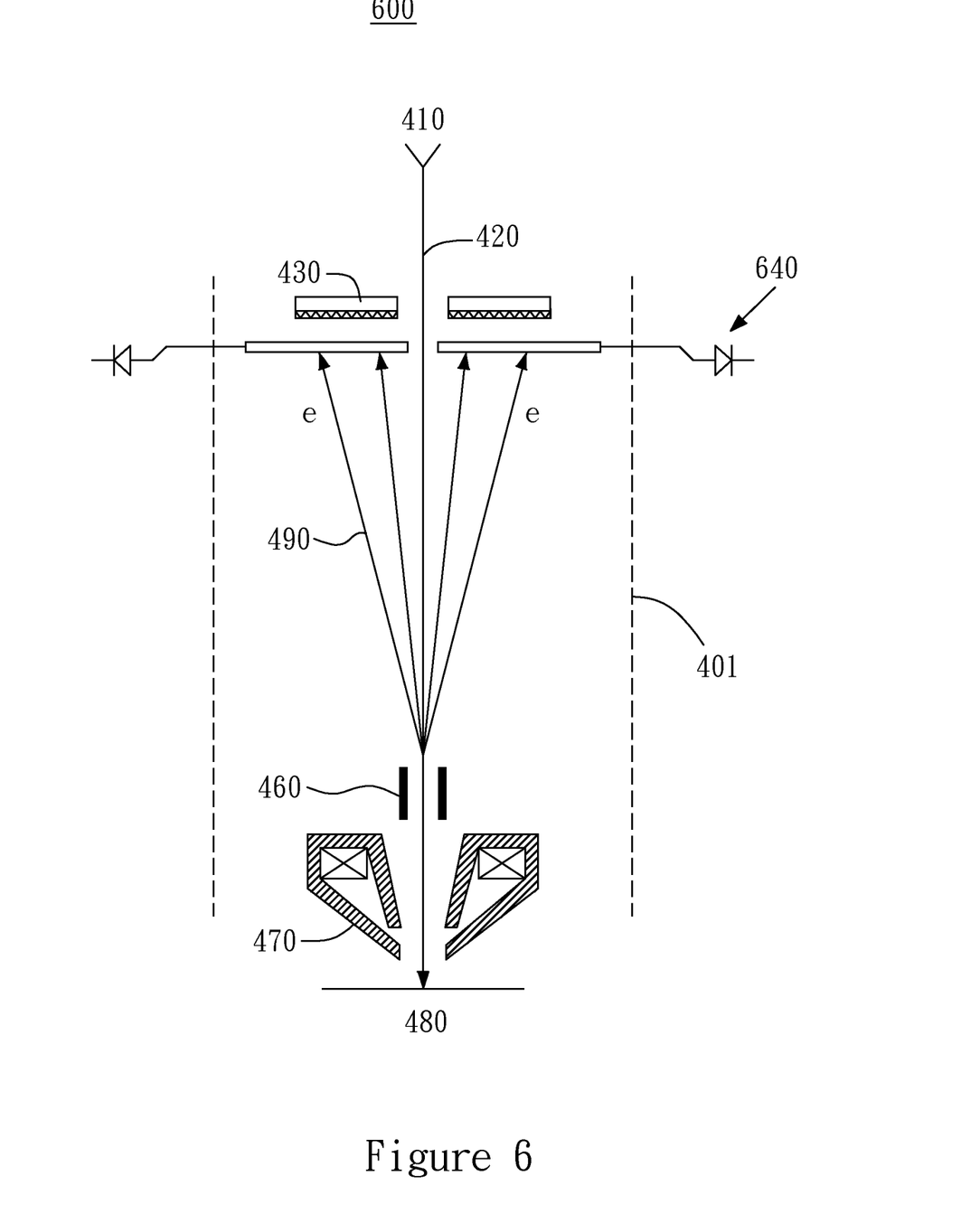
FIG. 6 is a diagrammatic representation of the position of a sectional high gain movable detector while performing anomalies review or fine detail inspection and composes a stereo anomaly image.

FIG. 6, which depicts another embodiment, illustrates the signal electrons trajectory and the position of a sectional movable detector while performing anomalies review or fine detail inspection with stereo image that also requires high resolution and small beam current. A charged particle beam 420 is emitted from a charged particle emitter (tip) 410 through objective lens 470 to a surface of target 480. The primary beam 420 is focused by the objective lens 470 into a beam probe and scanning across the target 480 surface by the deflector 460. Signal electrons 490, i.e. BSE and SE, that emanate from target 480 surface, are collected by a sectional movable high gain detector 640. The sectional movable high gain detector 640, which is on-axis primary beam of the, is in position within the e-beam column while performing an anomalies review or fine detail inspection with stereo image function is selected. Neither energy filter in front of any section of the high gain detector nor Wein filter is needed in this inspection process. The collected signal electrons are amplified and send to image processing unit (not shown) to compose stereo image of target surface. The sectional movable high gain detector 640 is pushed into a position from outside e-beam column boundary 401 when the high resolution mode is selected. The center hole of the sectional movable high gain detector 640 is a little larger than the original main detector 430 where the primary beam passing through. This design can also avoid complicate alignment process while positioning the sectional movable high gain detector 640.

In this invention, the movable detector is configured to the inspection tool that both low resolution mode and high resolution mode can be performed in situ. Individual detector of the main detector and the movable detector can adopt prior detectors and is very useful for nowadays defect inspection technology field.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A method for imaging a specimen surface by replacing a specified detection area to receive signal charged particles, the method comprising:
providing a charged particle beam system to irradiate charged particles onto the specimen surface;
providing a sectional main detector for receiving the signal charged particles emanated from the specimen surface, wherein the sectional main detector has at least two sections for configuring a first stereo image under a regular large beam current, low resolution mode;
providing a movable high gain detector set for receiving the signal charged particles emanated from the specimen surface or providing a movable sectional high gain detector for receiving the signal charged particles emanated from the specimen surface, wherein the movable high gain detector set, en above an objective lens of the charged particle beam system, has at least one section for configuring an image under a small beam current, high resolution mode, and the movable sectional high gain detector has at least two sections for configuring a second stereo image under the small beam current, high resolution mode;

providing an E×B charged particle analyzer to direct the signal charged particles emanated from the specimen surface to the detection area set;

providing a control computer to calculate superimposed magnetic field strength and electrostatic field strength of the E×B charged particle analyzer that diverts the emanated electrons according to an incident beam energy and preset imaging requirement; and generating images based on the detected signal particles received by one of the detectors.

2. The method of claim 1, wherein the sectional main detector is solid state detector.

3. The method of claim 1, wherein the sectional main detector is E-T detector.

4. The method of claim 1, wherein the movable high gain detector set is solid state detector.

5. The method of claim 4, wherein the movable high gain detector set is positioned not over the optical axis where the primary beam passing through.

6. The method of claim 4, wherein the movable high gain detector set is positioned into a column of the charged particle beam system when the low beam current, high resolution mode is selected.

7. The method of claim 1, wherein the movable sectional high gain detector is solid state detector.

8. The method of claim 7, wherein the movable sectional high gain detector is positioned below the main sectional detector when the low beam current, high resolution and stereo image mode is selected.

9. A signal receiving device for an inspection tool, said device comprising:

a first detector being on-axis to a primary beam of the inspection tool for configuring a stereo image;

a second detector, for receiving signal charged particles and on above an objective lens of the inspection tool, movable from outside of a column of the inspection tool into inside of the column wherein the second detector is positioned inside the column only when the second detector is used and the second detector is positioned outside the column for avoiding shielding the first detector when the second detector is not used and the first detector is in use; and means configured to move the second detector from outside the column into inside the column when the inspection tool is used in a small beam current, high resolution mode.

10. The signal receiving device according to claim 9, wherein the first detector has low gain than the second detector.

11. The signal receiving device according to claim 10, wherein the second detector is off-axis to the primary beam of the inspection tool.

12. The signal receiving device according to claim 11, further comprising an energy filter in front of a detection surface of the second detector to receive signal electrons with energy.

13. The signal receiving device according to claim 12, further comprising a Wein filter to direct the signals from the inspection tool to the second detector.

14. The signal receiving device according to claim 10, wherein the second detector is on-axis to the primary beam of the inspection tool.

15. The signal receiving device according to claim 14, wherein the first detector is over the second detector while the signal receiving device inspects a specimen in the inspection tool under a small beam current, high resolution mode.

16. The signal receiving device according to claim 9, wherein the first detector is above an objective lens of the inspection tool and receives a signal current larger than the second detector.

17. The signal receiving device according to claim 9, wherein the first detector is an E-T detector.

18. The signal receiving device according to claim 17, wherein the second detector is a solid state detector.

19. A method for imaging a specimen surface by replacing a specified detection area to receive signal charged particles, the method comprising:

providing a charged particle beam system to irradiate charged particles onto the specimen surface;

providing a sectional main detector for receiving the signal charged particles emanated from the specimen surface, wherein the sectional main detector has at least two sections for configuring a first stereo image under a regular large beam current, low resolution mode;

providing a movable high gain detector set for receiving the signal charged particles emanated from the specimen surface when the charged particle beam system is under the small beam current, high resolution mode or providing a movable sectional high gain detector for receiving the signal charged particles emanated from the specimen surface when the charged particle beam system is under the small beam current, high resolution mode, wherein the movable high gain detector set has at least one section for configuring an image under a small beam current, high resolution mode, and the movable sectional high gain detector has at least two sections for configuring a second stereo image under the small beam current, high resolution mode;

providing an E×B charged particle analyzer to direct the signal charged particles emanated from the specimen surface to the detection area set;

providing a control computer to calculate superimposed magnetic field strength and electrostatic field strength of the E×B charged particle analyzer that diverts the emanated electrons according to an incident beam energy and preset imaging requirement; and generating images based on the detected signal particles received by one of the detectors.

20. A signal receiving device for an inspection tool, said device comprising:

a first detector being on-axis to a primary beam of the inspection tool for configuring a stereo image; and a second detector movable from outside of a column of the inspection tool into inside of the column wherein the second detector is positioned inside the column only when the inspection tool is under the small beam current, high resolution mode is used and the second detector is positioned outside the column for avoiding shielding the first detector when the inspection tool is not under the small beam current, high resolution mode.

* * * * *